(12) United States Patent
Singh et al.

(10) Patent No.: US 11,051,407 B2
(45) Date of Patent: Jun. 29, 2021

(54) FACILITATING FILLING A PLATED THROUGH-HOLE OF A CIRCUIT BOARD WITH SOLDER

(71) Applicant: INTERNATIONAL BUSINESS MACHINES CORPORATION, Armonk, NY (US)

(72) Inventors: Prabjit Singh, Poughkeepsie, NY (US); Daniel J. Kearney, Ulster Park, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 252 days.

(21) Appl. No.: 16/167,705

(22) Filed: Oct. 23, 2018

(65) Prior Publication Data

US 2020/0128676 A1   Apr. 23, 2020

(51) Int. Cl.
   *B23K 3/08*    (2006.01)
   *H05K 3/00*   (2006.01)
   (Continued)

(52) U.S. Cl.
   CPC ......... *H05K 3/0094* (2013.01); *B23K 1/0016* (2013.01); *B23K 3/08* (2013.01);
   (Continued)

(58) Field of Classification Search
   None
   See application file for complete search history.

(56) References Cited

U.S. PATENT DOCUMENTS

| | | | | |
|---|---|---|---|---|
| 4,031,612 A | * | 6/1977 | Nicolas | .................. H05K 3/222 29/850 |
| 4,698,663 A | | 10/1987 | Sugimoto et al. | |
| (Continued) | | | | |

FOREIGN PATENT DOCUMENTS

EP          0618861 B1    1/1999

OTHER PUBLICATIONS

Saab, Mark A., "Applications of High-Pressure Balloons in the Medical Device Industry," Medical Device & Diagnostic Industry Magazine, Published Sep. 1, 2000 (pp. 1-10).
(Continued)

*Primary Examiner* — Devang R Patel
(74) *Attorney, Agent, or Firm* — Tihon Poltavets, Esq.; Kevin P. Radigan, Esq.; Heslin Rothenberg Farley & Mesiti P.C.

(57) ABSTRACT

Filing a plated through-hole of a circuit board with solder is facilitated by an apparatus which includes a wire solder assembly and a controller. The wire solder assembly includes a wire probe sized to extend into the plated through-hole from one side of the circuit board, and a solder block associated with the wire probe so that the probe passes through the solder block. The controller controls heating of the wire probe, when the wire probe is operatively inserted into the plated through-hole, by passing a current through the wire probe. The heating of the wire probe heats a conductive plating of the plated through-hole and melts the solder block. The heating of the conductive plating and the melting of the solder block causes the solder to migrate into the plated through-hole by capillary action to fill the plated through-hole with the solder.

10 Claims, 9 Drawing Sheets

(51) Int. Cl.
*H05K 1/11* (2006.01)
*B23K 1/00* (2006.01)
*B23K 101/42* (2006.01)

(52) U.S. Cl.
CPC .......... *H05K 1/115* (2013.01); *B23K 2101/42* (2018.08); *H05K 2201/09572* (2013.01); *H05K 2203/016* (2013.01); *H05K 2203/043* (2013.01); *H05K 2203/045* (2013.01); *H05K 2203/1115* (2013.01); *H05K 2203/163* (2013.01)

(56) References Cited

U.S. PATENT DOCUMENTS

| | | | |
|---|---|---|---|
| 4,813,128 A * | 3/1989 | Massopust | H05K 1/0212 174/84 R |
| 4,884,335 A * | 12/1989 | McCoy | H05K 3/34 29/839 |
| 4,914,267 A * | 4/1990 | Derbyshire | B29C 66/83241 219/85.1 |
| 5,290,970 A | 3/1994 | Currie | |
| 5,779,134 A | 7/1998 | Watson et al. | |
| 6,173,883 B1 | 1/2001 | Gorenz, Jr. et al. | |
| 6,216,938 B1 | 4/2001 | Card, Jr. et al. | |
| 6,252,779 B1 * | 6/2001 | Pierson | H05K 3/3436 361/774 |
| 6,349,871 B1 | 2/2002 | Card, Jr. et al. | |
| 6,437,254 B1 | 8/2002 | Crudo et al. | |
| 6,443,739 B1 | 9/2002 | Currie | |
| 6,453,549 B1 | 9/2002 | Bhatt et al. | |
| 6,539,618 B1 * | 4/2003 | Lyke | H01R 43/02 29/611 |
| 6,555,761 B2 | 4/2003 | Amir | |
| 6,818,477 B2 | 11/2004 | Veitschegger et al. | |
| 7,085,135 B2 | 8/2006 | Chu et al. | |
| 7,206,203 B2 | 4/2007 | Campbell et al. | |
| 7,987,587 B2 | 8/2011 | Becker et al. | |
| 8,729,398 B2 | 5/2014 | Duppong | |
| 9,125,301 B2 | 9/2015 | Sloane | |
| 9,408,327 B2 | 8/2016 | Albrecht, III et al. | |
| 9,480,141 B1 | 10/2016 | Hamadeh | |
| 2004/0211594 A1 | 10/2004 | Ho et al. | |
| 2011/0308847 A1 * | 12/2011 | Normann | H05K 1/111 174/258 |
| 2012/0122278 A1 * | 5/2012 | Lee | H01L 24/05 438/107 |
| 2013/0199767 A1 | 8/2013 | Karidis et al. | |

OTHER PUBLICATIONS

Gannon, Mary, "Why Use Compliant Pins in Connector Designs," https://www.connectortips.com/use-compliant-pins-connector-designs/, Jan. 16, 2014, (pp. 1-4).

Endres, Herbert, "Application and the Solder Processes," http://www.connector.com/application-and-the-solder-processes/, [Retrieved from the Internet on Jun. 14, 2018], (pp. 1-2).

Giesen et al., "Pin Assemblies for Plated Vias", U.S. Appl. No. 16/025,031, filed Jul. 2, 2018 (33 pages).

* cited by examiner

FACILITATING FILLING A PLATED THROUGH-HOLE OF A CIRCUIT BOARD WITH SOLDER

BACKGROUND

Circuit boards, such as printed circuit boards, or wiring boards, are used in a wide variety of electronic products. A circuit board mechanically supports and electrically connects electronic components and/or electrical components using conductive lines, pads and other features on or within one or more layers of the circuit board. In circuit board design, a through-hole extends through the circuit board, and can include, for instance, pads in appropriate positions on different layers on the board that are electrically connected by, for instance, a plating of the through-hole within the board. For instance, a through-hole can be made, in one or more embodiments, conductive by electroplating.

Traditionally, should a plated through-hole problem arise or be detected post manufacture of a circuit board, reworking the board can be difficult, and the board may need to be discarded.

SUMMARY

Certain shortcomings of the prior art are overcome and additional advantages are provided through the provision of an apparatus to facilitate filling a plated through-hole of a circuit board with solder. The apparatus includes a wire solder assembly and a controller. The wire solder assembly includes a wire probe sized to extend into the plated through-hole from one side of the circuit board, and a solder block associated with the wire probe. The wire probe passes through the solder block, and the controller controls heating of the wire probe. With the wire probe inserted into the plated through-hole, the controller controls heating of the wire probe by passing a current therethrough. The heating of the wire probe heats a conductive plating of the plated through-hole and melts the solder block. The heating of the conductive plating and melting of the solder block causing solder to migrate into the plated through-hole by capillary action to fill the plated through-hole with the solder.

In another aspect, a method of fabricating an apparatus to facilitate filling a plated through-hole of a circuit board with solder is provided. The method includes fabricating a wire solder assembly. Fabricating the wire solder assembly includes providing a wire probe sized to extend into the plated through-hole from one side of the circuit board, and associating a solder block with the wire probe such that the wire probe passes through the solder block. The method also includes providing a controller to control heating of the wire probe. With the wire probe inserted into the plated through-hole, the controller controls heating of the wire probe by passing a current therethrough. The heating of the wire probe heating a conductive plating of the plated through-hole and melting the solder block. The heating of the conductive plating and melting of the solder block causing solder to migrate into the plated through-hole by capillary action to fill the plated through-hole with the solder.

In a further aspect, a method of filling a plated through-hole of a circuit board with solder is provided. The method includes inserting a wire probe of a wire solder assembly into the plated through-hole from one side of the circuit board. The wire solder assembly also includes a solder block associated with the wire probe, and the wire probe passes through the solder block. The method further includes controlling, via a controller, heating of the wire probe within the plated through-hole by passing a current therethrough. The heating of the wire probe heats a conductive plating of the plated through-hole and melts the solder block associated with the wire probe. The heating of the conductive plating and the melting of the solder block causes solder to migrate into the plated through-hole by capillary action to fill the plated through-hole with the solder.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
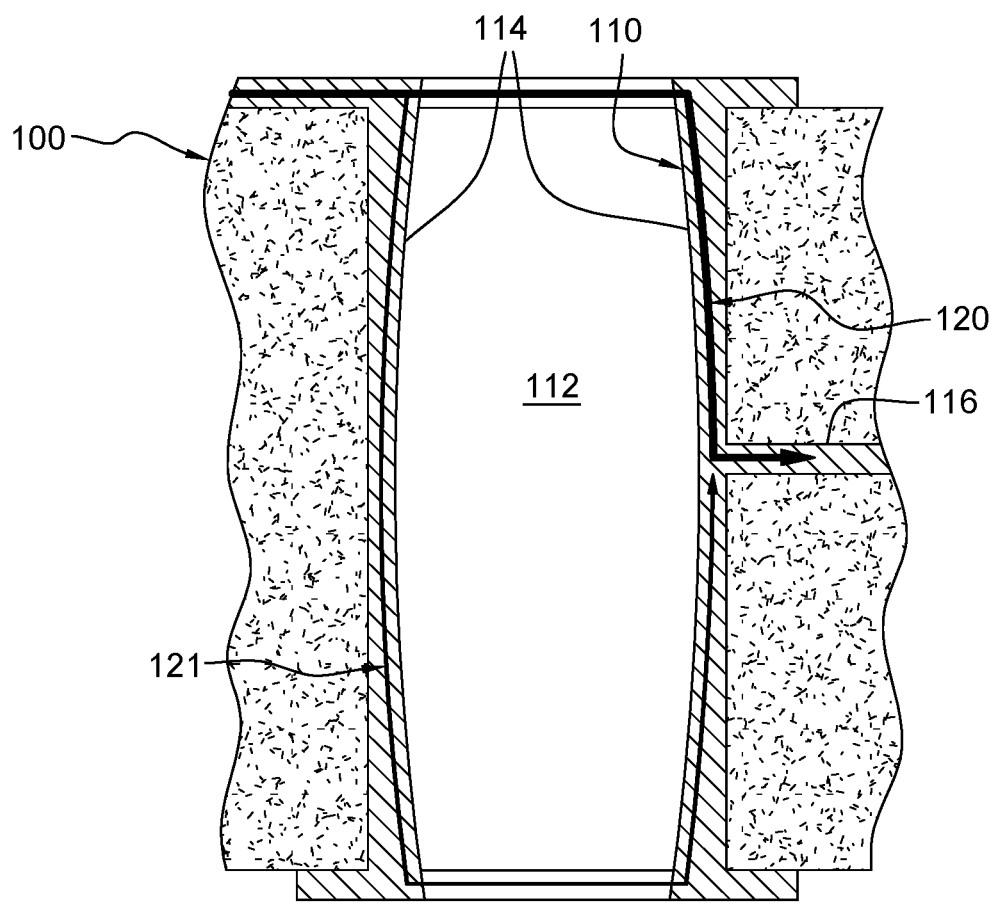
FIG. 1 depicts a partial cross-sectional elevational view of one embodiment of a circuit board with a plated through-hole, which can be enhanced, in accordance with one or more aspects of the present invention.

Aspects of the present invention and certain features, advantages and details thereof, are explained more fully below with reference to the non-limiting example(s) illustrated in the accompanying drawings. Descriptions of well-known systems, devices, processing techniques, etc., are omitted so as to not unnecessarily obscure the invention in detail. It should be understood, however, that the detailed description and the specific example(s), while indicating aspects of the invention, are given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application of filling a plated through-hole of a circuit board with solder using a wire solder assembly and controller, such as disclosed herein.

The illustrative embodiments are described below using specific designs, architectures, protocols, layouts, schematics, or tools only as examples, and are not limited to the illustrative embodiments. Furthermore, the illustrative embodiments may be described in certain instances using particular tools, and processing environments only as example for clarity of description. The illustrative embodiments can be used in conjunction with other comparable or similarly purposed structures, systems, applications, or architectures.

The examples in this disclosure are used only for clarity of description and are not limiting to the illustrative embodiments. Additional operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages can be realized by specific illustrative embodiments. Furthermore, a particular illustrative embodiment can have some, all, or none of the advantages listed herein.

As noted, reworking a circuit board, such as a printed circuit board, wiring board, etc., is difficult post manufacture should a problem be detected or arise, such as with a plated through-hole of the circuit board. For instance, re-spinning a circuit board is costly, and hand modifications to a circuit board are slow and can be challenging. In fact, certain board issues, such as a plated through-hole defects, can be difficult to address without a new build of the circuit board. As related issues, current and heat dissipation in a circuit board are common issues to be addressed in dense circuit designs. The most congested areas have the most difficult constraints for heat dissipation, and a solution to address these constraints is often adding during design more through-holes, or increasing the capacity of the through-holes to conduct greater heat. Another circuit board issue is that, in operation, high current density could lead to electro-migration and degradation of plated through-hole walls of the board.

A variety of approaches are available for filling a defective or underperforming plated through-hole. These include, for instance, wave soldering, hand soldering, and conventional filled through-holes. Unfortunately, wave soldering requires a keep out zone of 250 mils around the through-hole being filled, and other components. Hand soldering also requires a similar keep out zone and would be prone to failure modes, such as partial through-hole fill. Conventional filled through-holes cannot always be done, particularly on high resolution through-holes, due to microstrip layer thickness constraints, and typically cannot be performed with components attached to the circuit board. Further, filled plated through-holes typically would not be undertaken for fixing an individual through-hole, and can be a costly rework if undertaken. The thicker the board, the higher the likelihood that quality control problems could occur.

By way of example, FIG. 1 depicts one embodiment of a plated through-hole 110 within a circuit board 100 which might benefit from reworking to enhance electrical and/or thermal characteristics of the plated through-hole. As illustrated, plated through-hole 110 can include a through-hole 112, formed within circuit board 100, which has been plated 114, such as by electroplating, with a conductive material, such as a metal (e.g., copper). In one or more implementations, FIG. 1 depicts one example of a high resolution through-hole, where the resolution of the through-hole is defined by the board thickness divided by the through-hole diameter. In high resolution through-holes today, a barreling effect can occur (as shown) where the electroplated through-hole wall bows slightly outward in the middle. This bowing of the through-hole wall can be intrinsic to the plating process. Also, as shown in FIG. 1, circuit board 100 can have one or more power planes 116 centrally disposed within the circuit board and electrically connected to plated through-hole 110. As illustrated, in this configuration the bulk of the current 120 passing through plated through-hole 110 travels along the shortest path to power plane 116, with a smaller amount of current 121 passing along the opposite side of plated through-hole 110, and then up to power plane 116. The result is that the through-hole wall portion carrying the higher current 120 can be more likely to degrade, and result in a breakdown of the plated through-hole.

A circuit board with one or more poor-quality, unfilled, plated through-holes (PTHs) can lead to a rejection of the circuit board during fabrication. Disclosed herein are apparatuses and methods to facilitate repair of defective high-aspect ratio, unfilled PTHs by filling them with solder via an approach with very local solder and heat-affected zones.

More particularly, in one or more aspects, apparatuses and methods are provided herein to facilitate filling a plated through-hole of a circuit board with solder. Advantageously, the apparatuses and methods employ a wire solder assembly which includes a wire probe sized to extend into the plated through-hole from one side of the circuit board, and a solder block associated with the wire probe. The wire probe passes through the solder block, and a controller controls heating of the wire. With the wire probe inserted into the plated through-hole, the controller controls heating of the wire probe by passing a current through the wire. The heating of the wire probe is such as to heat the conductive plating of the plated through-hole and also melt the solder block. The heating of the conductive plating and the melting of the solder block cause solder to migrate into the plated through-hole by capillary action to fill the plated through-hole with the solder.

Advantageously, using the above-noted apparatus, the plated through-hole is heated from inside by passing current through the wire probe positioned within the plated through-hole. The solder block or solder bead is of sufficient volume to fill the plated through-hole when melted. Thus, rather than using a solder paste, which can lead to flux trapped in the plated through-hole, solder spreads from one side of the circuit board (using the apparatuses and methods disclosed herein) by capillary action, which pushes any flux and contamination ahead of it, and out of the way of the solder joint. Also, using the apparatuses and methods disclosed herein, the heat and solder-affected zones of the circuit board are limited to a very small zone. In particular, the heat-affected zone using the apparatuses and methods disclosed herein is significantly reduced compared with prior approaches, such as wave-soldering, hand-soldering, and laser-soldering, since heat is applied mostly inside the plated through-hole, and not outside the through-hole. Also, if desired, solder can be applied to just one plated through-hole being repaired in a circuit board.

Figure 2A:
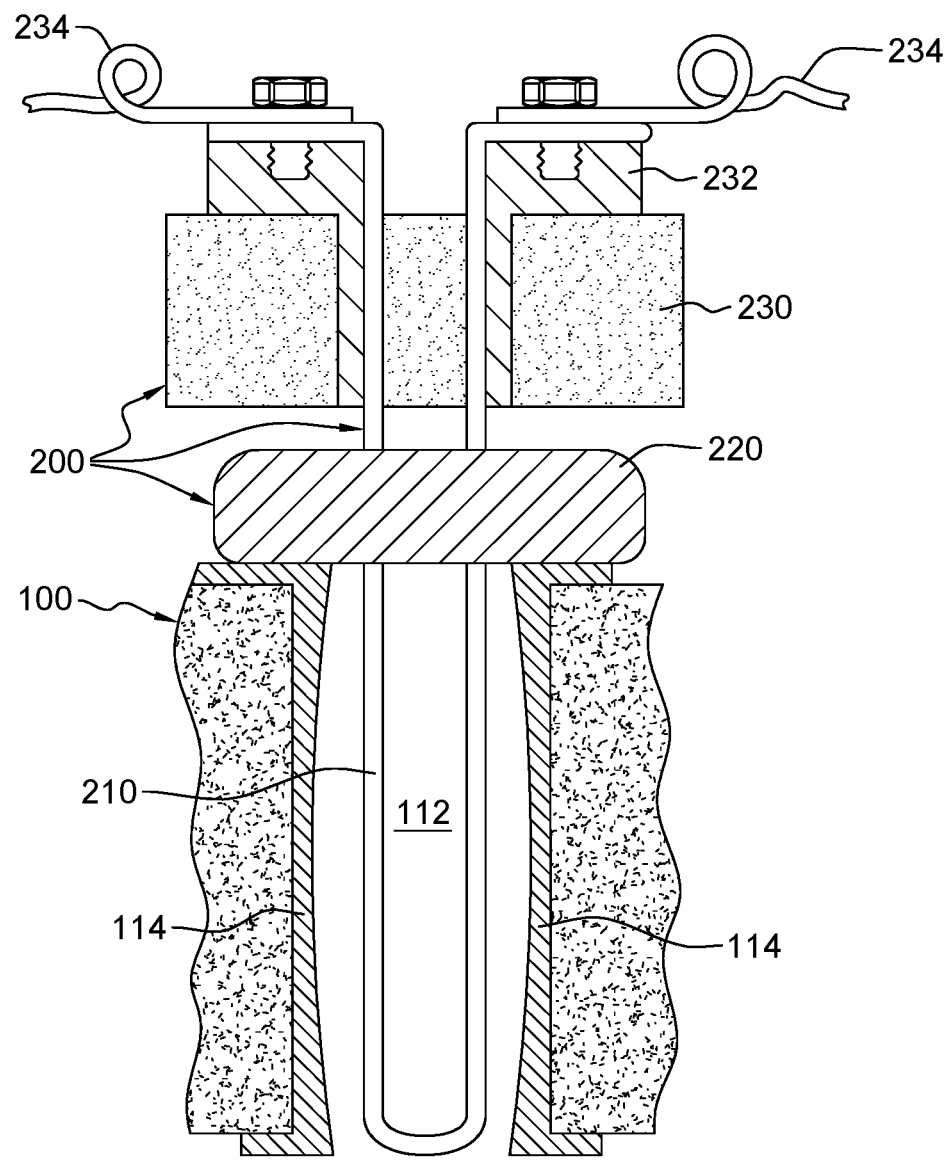
FIG. 2A is a partial cross-sectional elevational view of one embodiment of a wire solder assembly positioned, in part, within a plated through-hole of a circuit board, in accordance with one or more aspects of the present invention.

FIG. 2A depicts one embodiment of an apparatus 200 to facilitate filling a plated through-hole 112 of a circuit board 100, in accordance with one or more aspects of the present invention. As shown, apparatus 200 includes a wire solder assembly that includes a wire probe 210 and a solder block 220 associated with the wire probe. In FIG. 2A, wire probe 210 is shown inserted into plated through-hole 112 from one side of circuit board 100, and is also shown passing through solder block 220, with solder block 220 resting on, for instance, a conductive pad coupled to the plating 114 of the plated through-hole. Note in this regard that through-hole 112 is assumed to have been plated with a conductive material 114, such as copper, using any conventional plating process.

Apparatus 200 further includes a support block 230, such as an insulator support block, as well as contact terminals 232 of wire probe 210, to which wires 234 are electrically connected, in one or more embodiments, to provide current through the wire probe. Note that in one or more other embodiments, conductive probes could be brought into electrical contact with contact terminals 232 to provide current to wire probe 210, as discussed herein.

In one or more embodiments, wire probe 210 can be a disposable glass-insulated wire, such as a glass-insulated nichrome wire, and solder block 220 can be a solder bead residing on the upper end of wire probe 210. Solder block 220 is provided with enough volume to fill the plated through-hole when melted, as discussed herein. Advantageously, the glass insulation over the wire is a glass coating on the wire, which is provided to isolate the wire from the melting solder. Without an insulative glass or other insulative coating, the wire could be short-circuited by the melting solder, and cool down prematurely. Note that wire probe 210 can have any of a variety of configurations, with a simple looped wire configuration being shown by way of example only. For instance, in one or more other embodiments, the wire probe can be spiral-shaped, or other-shaped, where inserted into through-hole 112 to provide, if desired, a greater volume of wire within the plated through-hole. With wire probe 210 inserted into the plated through-hole, and solder block 220 contacting and pressing against the plated through-hole conductive pad, the wire is heated by driving a current through the wire using a current source, such as a variable current source (see FIG. 4).

Figure 2B:
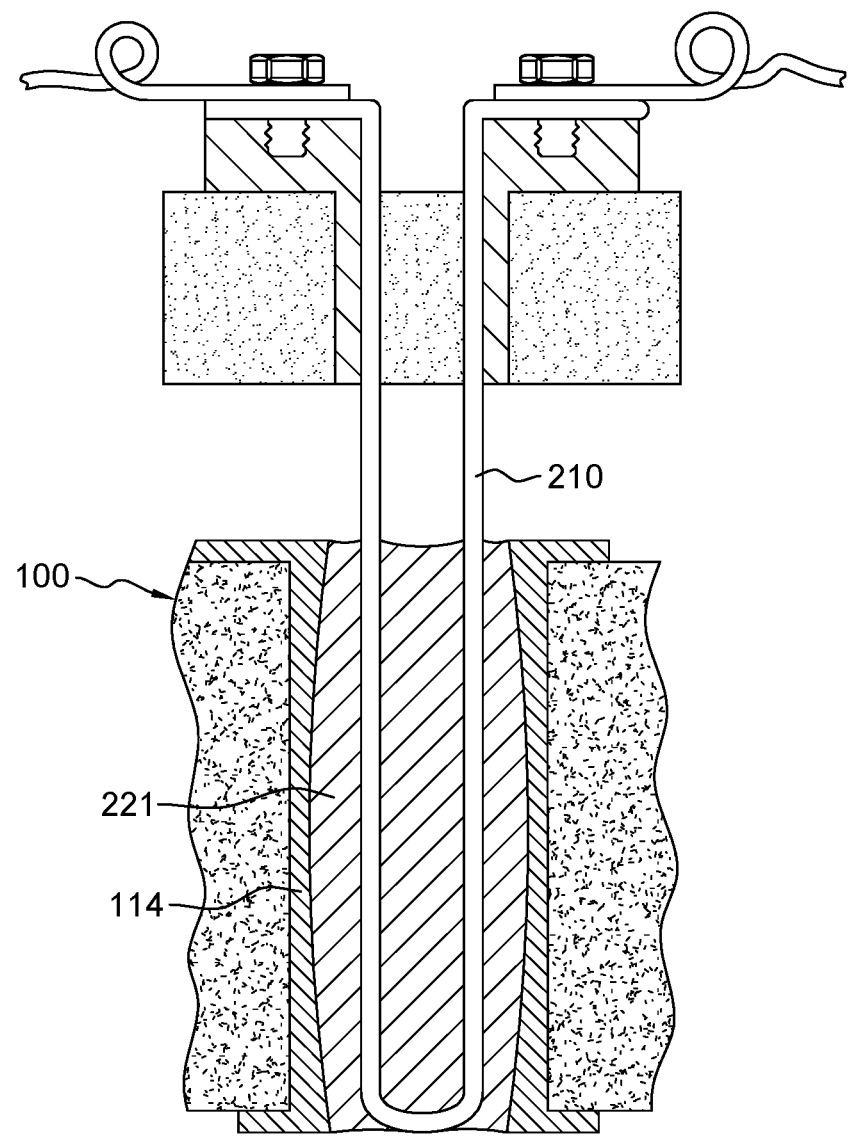
FIG. 2B depicts the assembly of FIG. 2A, after heating of the conductive plating and melting of the solder block to fill the plated through-hole with solder, in accordance with one or more aspects of the present invention.

As illustrated in FIG. 2B, driving current through wire probe 210 results in heating of the inside of the plated through-hole, as well as melting of solder block 220, such that solder 221 migrates by capillary action along the conductive plating, into the plated through-hole, and fills the plated through-hole. If desired, an inert gas (such as nitrogen or argon) can be inserted from the bottom of the plated through-hole to flood the plated through-hole volume and the surrounding surfaces that are to be heated during this process. The inert gas can advantageously be used to reduce oxidation of copper, where the plated through-hole is a copper-plated through-hole. With reduced oxidation of the copper, the copper surfaces are more readily wetted to the molten solder. Further, use of an inert gas may reduce or even eliminate the need to apply flux to the plated through-hole prior to the soldering operation. Advantageously, as the solder block melts and the molten solder 221 moves down the conductive plating 114 of the plated through-hole by capillary action, any gases, flux residue and contamination are pushed ahead of the melted solder, and away and out from the solder within the plated through-hole. Once the through-hole is filled with solder, capillary action will end, and solder will stop flowing downward. Therefore, solder will not flood the bottom surface of the circuit board 100 with this process.

Figure 2C:
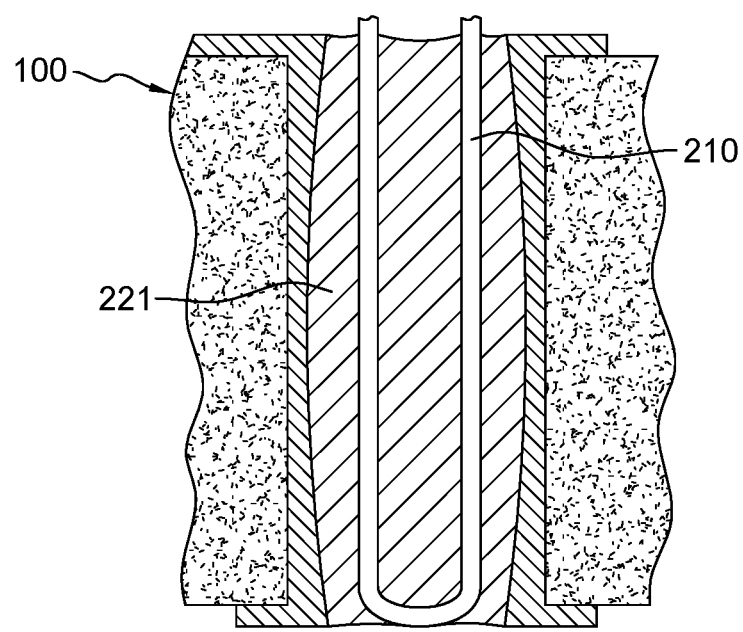
FIG. 2C depicts the assembly of FIG. 2B, after cutting the wire probe, in accordance with one or more aspects of the present invention.

After the solder 221 has cooled, the wire probe 210 can be cut, as illustrated in FIG. 2C, to remove the support block and contact terminals from the resultant circuit board 100. In one or more embodiments, the cutting of the wire can be substantially flush with the surface of the circuit board.

Figure 3A:
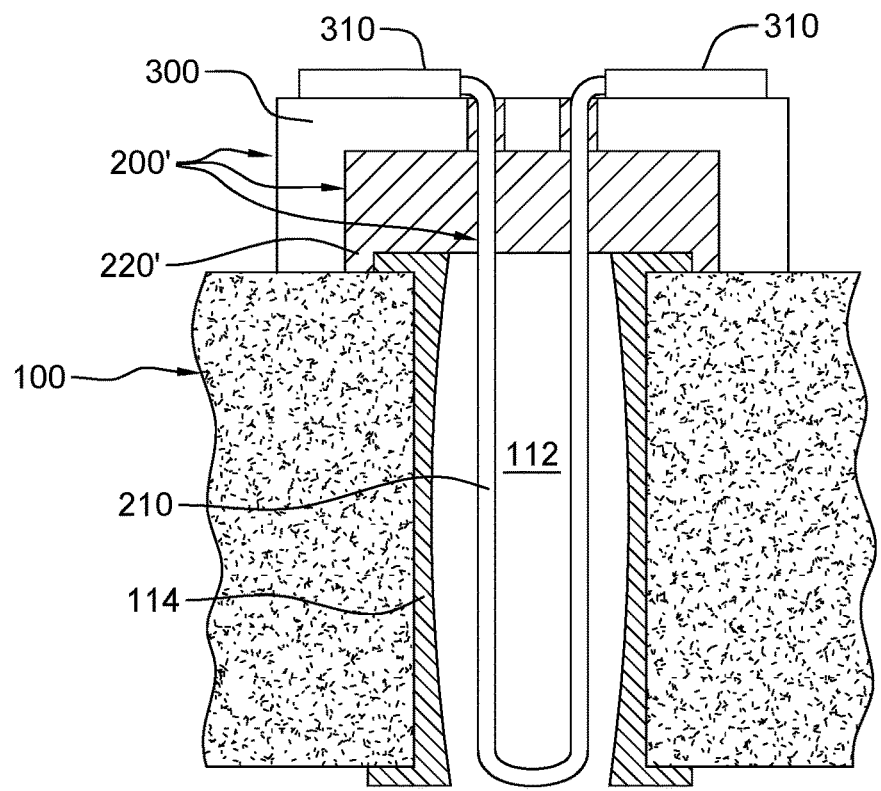
FIG. 3A is a partial cross-sectional elevational view of an alternate embodiment of a wire solder assembly positioned, in part, within a plated through-hole of a circuit board, in accordance with one or more aspects of the present invention.

FIG. 3A depicts another embodiment of an apparatus 200' to facilitate filling a plated through-hole 112 of circuit board 100, in accordance with one or more aspects of the present invention. Apparatus 200' includes a wire solder assembly that includes wire probe 210 and solder block 220' in contact with wire probe 210. In FIG. 3A, wire probe 210 is shown inserted into plated through-hole 112 from one side of circuit board 100. As shown, wire probe 210 passes through solder block 220', and solder block 220' is brought to rest on, for instance, a conductive pad coupled to plating 114 of the plated through-hole. Further, apparatus 200' includes a carrier 300 which rests on a surface of circuit board 100 and includes a central recess to hold solder block 220'. Electrical contact pads 310 are provided on an exposed surface of carrier 300, which in one or more embodiments, can be a ceramic carrier. As shown, wire probe 210 is electrically bonded to electrical contact pads 310.

Figure 3B:
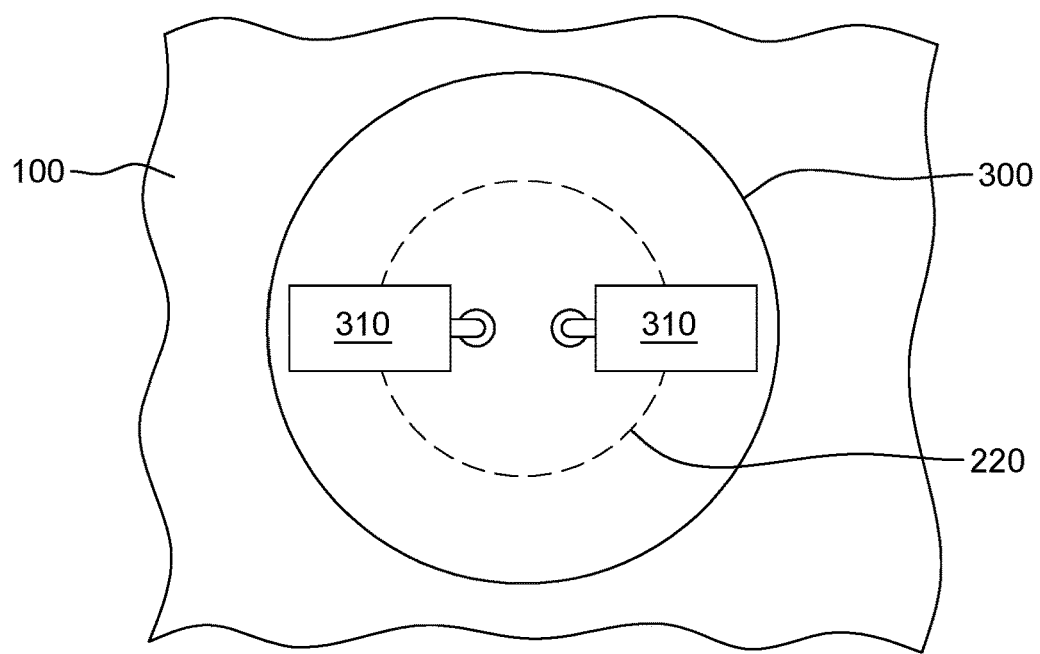
FIG. 3B is a partial plan view of the circuit board and wire solder assembly of FIG. 3A, in accordance with one or more aspects of the present invention.

As shown in FIG. 3B, in one or more embodiments, carrier 300 can be configured with a circular shape, or any other desired shape, and be sized to overly a particular plated through-hole which is to be reworked with solder, as discussed herein. Advantageously, with a configuration such as depicted in FIGS. 3A & 3B, solder can be pre-loaded into carrier 300, and upon completion of melting of the solder to fill the plated through-hole, the carrier and contact pad assembly can be removed, for instance, by twist off, or remain in place on the surface of the printed circuit board. Further, as with the example described above in connection with FIGS. 2A-2C, solder block 220' can be formed of any of a variety of available solders, and wire probe 210 can be any of a variety of resistive wires, such as a glass-coated nichrome wire, as one example only. Further, note that wire probe 210 can have any of a variety of configurations, with the looped wire configuration of FIGS. 3A & 3B also being shown by way of example only.

Figure 4:
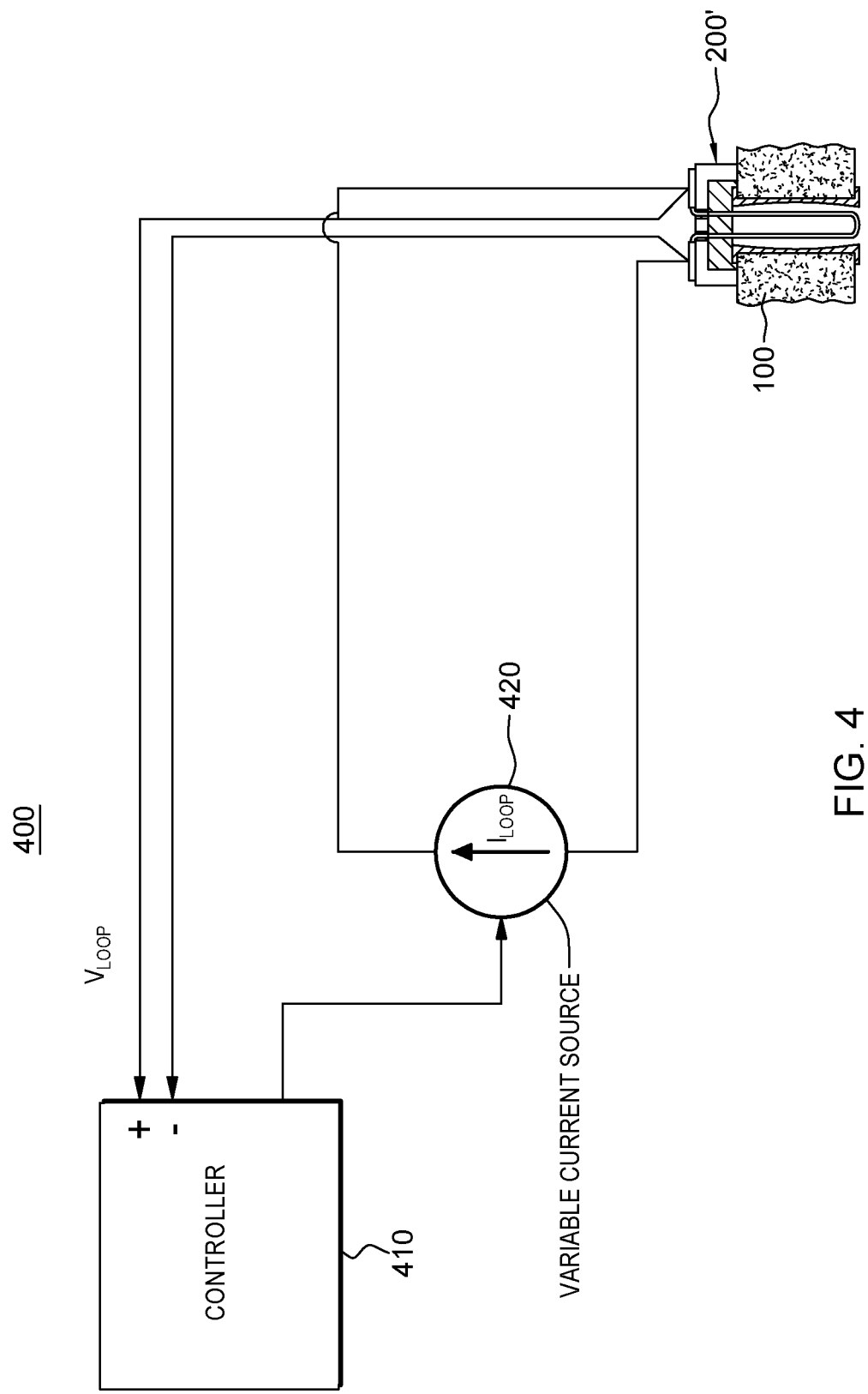
FIG. 4 is a schematic of one embodiment of an apparatus to facilitate filling a plated through-hole of a circuit board with solder, in accordance with one or more aspects of the present invention.

FIG. 4 depicts one embodiment of an apparatus 400 which includes, in part, an apparatus 200', such as described above in connection with FIGS. 3A & 3B, with the wire probe of the wire solder assembly shown inserted within a plated through-hole of circuit board 100 to be filled with solder, in accordance with one or more aspects of the present invention. As shown, apparatus 400 also includes a controller 410 and a variable current source 420. Controller 410 controls variable current source 420 to control the current applied to apparatus 200' to heat the wire probe, and thereby heat the conductive plating and melt the solder, as described herein. Controller 410 further includes or monitors a voltage loop, so that controller 410 knows throughout the process the current flow through the wire probe, and the voltage across the wire probe.

In one or more embodiments, pogo-type contact pins can electrically connect the variable current source 420, and controller 410, in electrical contact with the electrical contact pads on the top of the carrier. Note that controller 410 and variable current source 420 could be used to drive and monitor current and voltage across any of a variety of wire probes, and associated apparatuses such as described herein in connection with FIGS. 2A-3B.

Figure 5A:
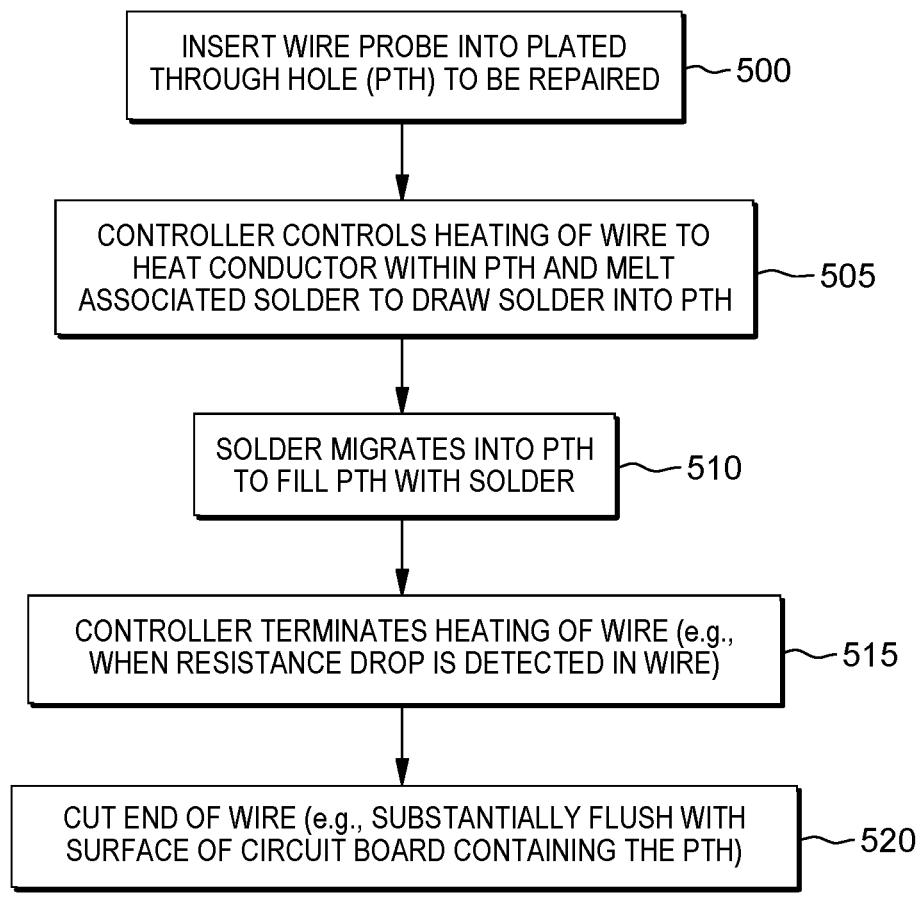
FIG. 5A depicts one embodiment of a process for filling a plated through-hole of a circuit board with solder, in accordance with one or more aspects of the present invention.

FIG. 5A depicts one embodiment of a process for filling a plated through-hole of a circuit board with solder using an apparatus such as depicted in FIG. 4.

As shown in FIG. 5A, the filling process includes inserting the wire probe into a plated through-hole (PTH) to be repaired 500. For instance, a disposable glass-insulated nichrome wire probe can be inserted and pressed into a plated through-hole so that the solder block associated with the wire probe is touching and pressing against the plated through-hole contact pad on one side of the circuit board. The controller controls heating of the wire to heat the conductive plating within the plated through-hole, and melt the solder associated with the wire probe to draw the solder into the plated through-hole via capillary action 505. If desired, an inert gas can be provided from the bottom of the plated through-hole to flood the plated through-hole volume and surrounding surfaces that will get hot.

As the probe wire conducts current, the probe wire heats, and the conductive plating on the walls of the plated through-hole is heated, and the solder block is melted. As the solder block melts, the solder migrates into the plated through-hole to fill the plated through-hole with solder 510. By controlling the current through the probe wire and measuring the voltage across the probe wire, the controller is able to infer from the determined resistance changes in the wire when the solder melt process is complete, and the plated through-hole is filled with solder. For instance, temperature of the wire can be determined by controller 410. The wire temperature is proportional to the wire resistance. The resistance of the wire can be measured by dividing the voltage across the wire by the current through the wire. The resistance of the wire can be converted to wire temperature therefore, using a resistance versus temperature data structure or table stored within or accessible by controller 410. When current is first passed through the wire, the wire becomes very hot, and may even turn red. When the solder melts, typically in the range of 200° C.-230° C., the wire temperature will be quenched to the molten solder temperature. The sudden drop in wire temperature, and wire resistance, is an indication that the solder has melted. To ensure a good solder joint, there can be a delayed shut-off of the current through the wire probe to give the solder time at melt temperature to form a good metallurgical joint between the solder and the plated metal (e.g., copper) of the plated through-hole.

Upon determining that the process is complete, the controller terminates heating of the wire 515. For instance, a particular resistance change can be predetermined for the wire solder assembly and type of plated through-hole as being or correlating to a filled PTH state. With this predetermined information, the currently determined resistances can be compared against the predetermined patterns by the controller to determine when to terminate the process. Once the solder has cooled, the end of the wire can be cut, for instance, substantially flush with the surface of the circuit board containing the plated through-hole 520.

Figure 5B:
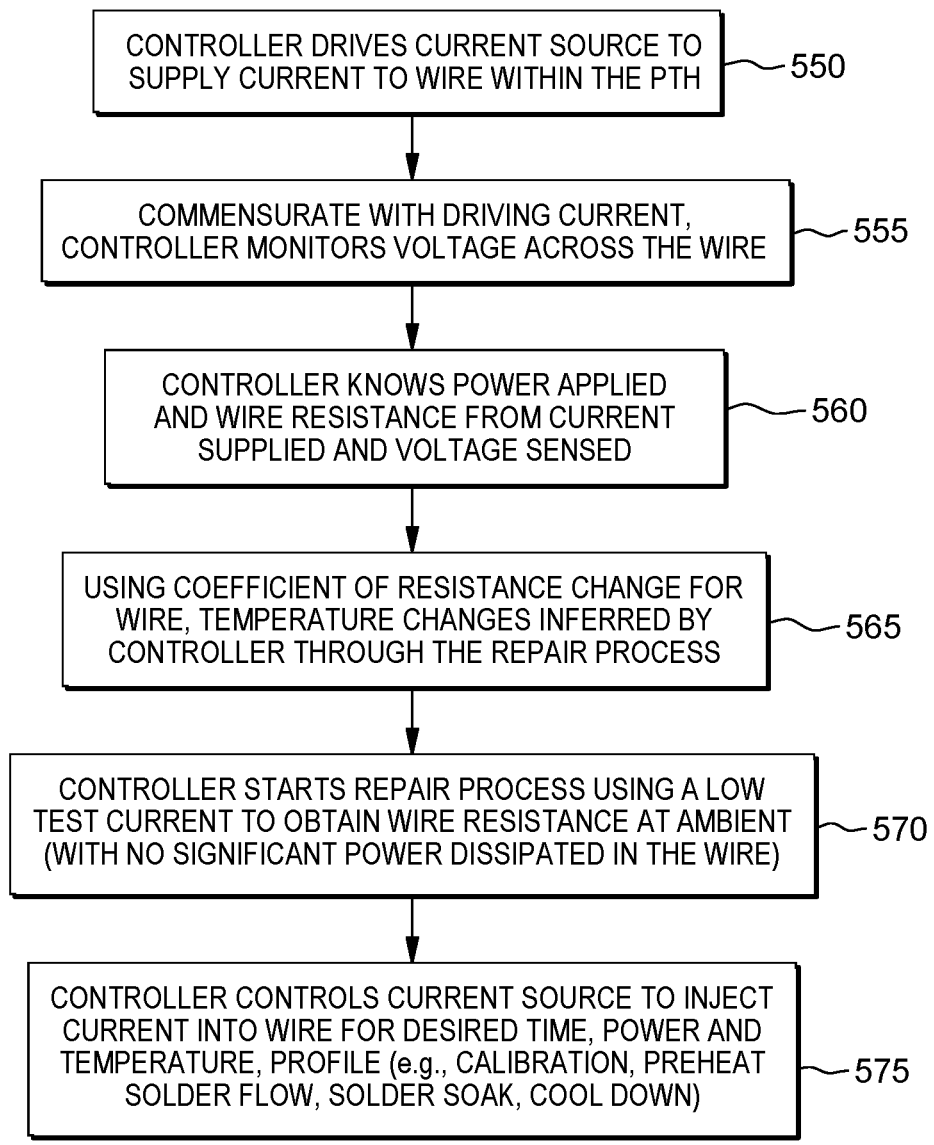
FIG. 5B depicts one embodiment of a process for controlling filling of a plated through-hole of a circuit board with solder, in accordance with one or more aspects of the present invention.

FIG. 5B depicts one embodiment of a process for controlling filling of a plated through-hole of a circuit board with solder, in accordance with one or more aspects of the present invention.

As noted, the controller controls or drives the current source to supply current to the wire probe within the plated through-hole 550. Commensurate with driving the current, the controller monitors the voltage across the wire 555. Using this information, the controller knows the power applied, and the wire resistance from the current supplied and the voltage sensed 560. Using a coefficient of resistance change for the probe wire (for instance, nichrome wire has a coefficient of resistance change of 4.00 $E^{-04}$ PEI ° C.), temperature changes can be inferred by the controller throughout the repair process 565. The controller can start the repair process by using a very low test current to obtain the wire probe resistance at ambient temperature (i.e., with significantly no power dissipated within the wire) 570. The controller continues to control the current source to inject current into the wire probe for a desired amount of time, power and temperature profile (for instance, for a desired calibration, preheat, solder flow, solder soak, solder cool-down) 575.

In one or more embodiments, the controller can inject current into the wire probe until the voltage collapses, that is, until a particular resistance drop is detected, which may correspond to full melting of the solder and filling of the plated through-hole with solder. If desired, the wire probe, such as a glass-coated nichrome wire, can have selected areas uncoated to short-out the probe wire, that is, from one portion of the loop to the other, when solder flow is substantially complete within the plated through-hole.

In one or more other embodiments, rather than being glass-insulated, the probe wire could have a Teflon coating. Further, in one or more embodiments, a copper coating could be provided over a glass-coated nichrome wire probe to, for instance, further facilitate migration of melted solder into the PTH via capillary action. Other variations will also be apparent to those skilled in the art, and are considered a part of the present application. Further, note that the wire probe and the looped wire configuration is presented by way of example only. Other shapes could also be used for the wire probe. For instance, the wire probe could be a coil on a glass or ceramic rod carrier that extends into the plated through-hole, or any one of many other shapes, depending on the size of the wire probe and plated through-hole being repaired.

Figure 6:
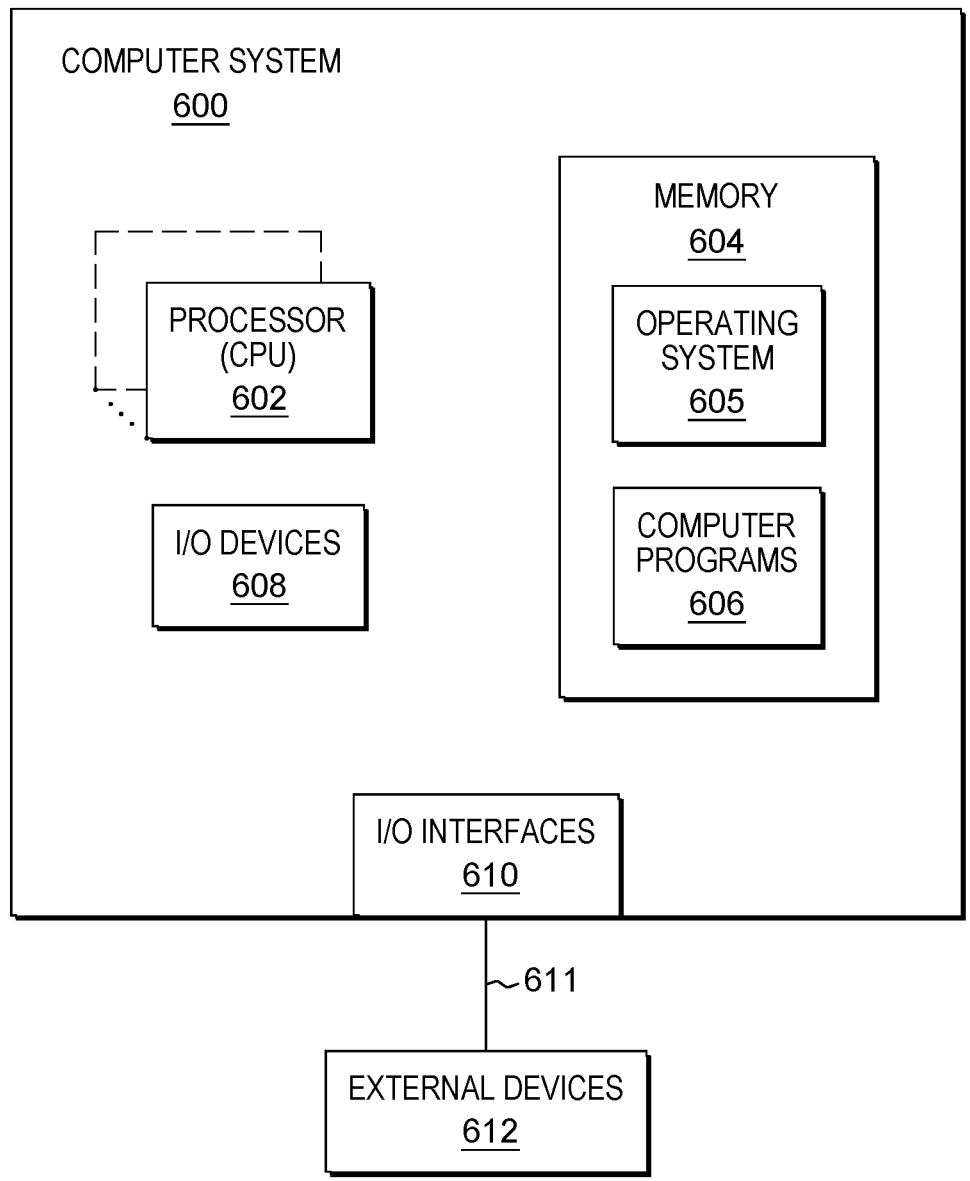
FIG. 6 depicts one example of a computer environment to incorporate or facilitate one or more aspects of the present invention.

One or more aspects of the controller discussed herein can be performed by, implemented in association with, or otherwise facilitated by a computer system, one embodiment of which is depicted in FIG. 6. A computer system can be based on one of various system architectures and/or instruction set architectures, such as those offered by International Business Machines Corporation (Armonk, N.Y., USA), Intel Corporation (Santa Clara, Calif., USA) or ARM Holdings PLC (Cambridge, England, United Kingdom), as examples.

FIG. 6 shows a computer system 600 in communication with external device(s) 612. Computer system 600 includes one or more processor(s) 602, for instance, central processing unit(s) (CPUs). A processor can include functional components used in the execution of instructions, such as functional components that fetch program instructions from locations such as cache or main memory, decode program instructions, execute program instructions, access memory for instruction execution, and write results of the executed instructions. A processor 602 can include register(s) to be used by one or more of the functional components. Computer system 600 also includes memory 604, input/output (I/O) devices 608, and I/O interfaces 610, which can be coupled to processor(s) 602 and each other via one or more busses and/or other connections. Bus connections represent one or more of any of several types of bus structures, including a memory bus or memory controller, a peripheral bus, and a processor or local bus using any of a variety of bus architectures known in the art.

Memory 604 can be or include main or system memory (e.g., random access memory) used in the execution of program instructions, a storage device(s) such as hard drive (s), flash media or optical media as examples, and/or cache memory, as examples. Memory 604 can include, for instance, a cache, such as a shared cache, which can be coupled to local caches (examples include L1 cache, L2 cache, etc.) of processor(s) 602. Additionally, memory 604 can be or include at least one computer program product having a set (e.g., at least one) of program modules, instructions, code or the like that is/are configured to carry out the functions of various control aspects described herein when executed by one or more processors.

Memory 604 can store an operating system 605 and other computer programs 606, such as one or more computer programs/applications that execute to perform aspects described herein. Specifically, program/applications can include computer readable program instructions that can be configured to carry out functions of embodiments of aspects described herein.

Examples of I/O devices 608 include but are not limited to accelerometers, magnetometers, and/or other sensor devices coupled to, for instance, sense motion, etc. An I/O device can be incorporated into the computer system as shown, though in some embodiments an I/O device can be regarded as an external device 612 coupled to the computer system through one or more I/O interfaces 610.

Computer system 600 can communicate with one or more external devices 612 via one or more I/O interfaces 610. Example external devices include any device that enables computer system 600 to communicate with one or more other devices, such as an anti-tip mechanism described herein. A communication between I/O interfaces 610 and external devices 612 can occur across wired and/or wireless communication link(s) 611, such as Ethernet-based wired or wireless connections. Example wireless connections include cellular, Wi-Fi, Bluetooth®, proximity-based, near field, or other types of wireless connections. More generally, communication link(s) 611 can be any appropriate wireless and/or wired communication link(s) for communicating data. Computer system 600 can take any of various forms, well known examples of which include, but are not limited to, personal computer (PC) system(s), server computer system(s), laptop(s), tablet(s), multiprocessor system(s), multi-processor-based system(s), etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus to facilitate filling a plated through-hole of a circuit board with solder, the apparatus comprising:
a wire solder assembly comprising:
an insulator support;
a wire probe sized to extend from the insulator support into the plated through-hole from one side of the circuit board; and
a solder block associated with the wire probe, the wire probe passing from the insulator support through the solder block, and the solder block having a width larger than a diameter of the plated through-hole, wherein the solder block is positioned relative to the wire probe to contact a conductive pad coupled to the plated through-hole, outside the plated through-hole, when the wire probe is operatively positioned to extend into the plated through-hole from the one side of the circuit board; and
a controller to control heating of the wire probe, wherein with the wire probe inserted into the plated through-hole, the controller controls heating of the wire probe by passing a current therethrough, the heating of the wire probe heating a conductive plating of the plated through-hole and melting the solder block, the heating of the conductive plating and the melting the solder block causing solder to migrate by capillary action from outside the plated through-hole into the plated through-hole to fill the plated through-hole with the solder.

2. The apparatus of claim 1, wherein the insulator support supports the wire probe in a looped wire configuration, and includes electrical contact pads to electrically connect a current source, controlled by the controller, to the wire probe.

3. An apparatus to facilitate filling a plated through-hole of a circuit board with solder, the apparatus comprising:
a wire solder assembly comprising:
a wire probe sized to extend into the plated through-hole from one side of the circuit board; and
a solder block associated with the wire probe, the wire probe passing through the solder block; and
a controller to control heating of the wire probe, wherein with the wire probe inserted into the plated through-hole, the controller controls heating of the wire probe by passing a current therethrough, the heating of the wire probe heating a conductive plating of the plated through-hole and melting the solder block, the heating of the conductive plating and the melting the solder block causing solder to migrate into the plated through-hole by capillary action to fill the plated through-hole with the solder;

wherein the wire solder assembly includes an insulator support supporting the wire probe in a looped wire configuration, and electrical contact pads to electrically connect a current source, controlled by the controller, to the wire probe; and wherein the insulator support comprises a ceramic carrier, the ceramic carrier accommodating the solder block in a recess therein, wherein when in use, the ceramic carrier rests on the one side of the circuit board with the wire probe inserted into the plated through-hole.

4. The apparatus of claim 2, wherein the wire probe in the looped wire configuration is of sufficient length to extend, when inserted into the plated through-hole, substantially a full length of the plated through-hole.

5. The apparatus of claim 1, wherein the wire probe comprises a coated wire, the coated wire being an at least partially glass-insulated wire.

6. The apparatus of claim 5, wherein the coated wire includes an uncoated portion to allow shorting out of the wire probe within the plated through-hole with solder migration into the plated through-hole reaching the uncoated portion.

7. The apparatus of claim 5, wherein the plated through-hole is a copper-plated through-hole, and the coated wire comprises a glass-insulated nichrome wire.

8. An apparatus to facilitate filling a plated through-hole of a circuit board with solder, the apparatus comprising:
a wire solder assembly comprising:
a wire probe sized to extend into the plated through-hole from one side of the circuit board; and
a solder block associated with the wire probe, the wire probe passing through the solder block; and
a controller to control heating of the wire probe, wherein with the wire probe inserted into the plated through-hole, the controller controls heating of the wire probe by passing a current therethrough, the heating of the wire probe heating a conductive plating of the plated through-hole and melting the solder block, the heating of the conductive plating and the melting the solder block causing solder to migrate into the plated through-hole by capillary action to fill the plated through-hole with the solder; and wherein:
the wire probe comprises a coated wire, the coated wire being an at least partially glass-insulated wire;
the plated through-hole is a copper-plated through-hole, and the coated wire comprises a glass-insulated nichrome wire; and
the glass-insulated nichrome wire of the wire probe is copper-coated to facilitate migration of the solder into the plated through-hole.

9. The apparatus of claim 1, wherein the solder block is of sufficient volume to fill, when melted, the plated through-hole, with the wire probe positioned within the plated through-hole.

10. The apparatus of claim 1, wherein the controller is configured to cease heating of the wire probe by terminating passing current through the wire probe based on determining that a resistance change in the wire probe has occurred, indicative of filling the plated through-hole with solder.

* * * * *